US010921351B2

(12) United States Patent
Huang et al.

(10) Patent No.: US 10,921,351 B2
(45) Date of Patent: Feb. 16, 2021

(54) ELECTRONIC SYSTEM, SENSING CIRCUIT AND SENSING METHOD

(71) Applicant: Wistron Corporation, New Taipei (TW)

(72) Inventors: Po-Yen Huang, New Taipei (TW); Cheng-Wei Huang, New Taipei (TW); Sin-Fang Wang, New Taipei (TW); Jiun-Lin Tseng, New Taipei (TW); Yen-Hsiang Wang, New Taipei (TW)

(73) Assignee: Wistron Corporation, New Taipei (TW)

( * ) Notice: Subject to any disclaimer, the term of this patent is extended or adjusted under 35 U.S.C. 154(b) by 95 days.

(21) Appl. No.: 16/134,920

(22) Filed: Sep. 18, 2018

(65) Prior Publication Data

US 2020/0003807 A1 Jan. 2, 2020

(30) Foreign Application Priority Data

Jul. 2, 2018 (TW) ................................ 107122745

(51) Int. Cl.
*G01R 19/165* (2006.01)
*G06F 1/14* (2006.01)
*H03K 3/037* (2006.01)
*H03K 5/24* (2006.01)

(52) U.S. Cl.
CPC ......... *G01R 19/16576* (2013.01); *G06F 1/14* (2013.01); *H03K 3/037* (2013.01); *H03K 5/24* (2013.01)

(58) Field of Classification Search
CPC ...... G01R 19/16576; G06F 1/14; H03K 5/24; H03K 3/037; H03K 3/023
See application file for complete search history.

(56) References Cited

U.S. PATENT DOCUMENTS

| | | | | |
|---|---|---|---|---|
| 6,772,361 | B1 * | 8/2004 | Walsh | G06F 1/14 713/502 |
| 7,015,740 | B1 | 3/2006 | Feinberg | |
| 2004/0225439 | A1 * | 11/2004 | Gronemeyer | G06F 1/3203 701/469 |
| 2009/0085610 | A1 * | 4/2009 | Westwick | H03K 5/24 327/68 |
| 2011/0022864 | A1 * | 1/2011 | Haiplik | G06F 1/14 713/322 |
| 2016/0056828 | A1 * | 2/2016 | Ueki | H03M 1/002 341/155 |

FOREIGN PATENT DOCUMENTS

CN 1809727 A 7/2006

* cited by examiner

*Primary Examiner* — Akm Zakaria
(74) *Attorney, Agent, or Firm* — Winston Hsu

(57) ABSTRACT

The present invention provides a sensing circuit, for sensing a working status of a real-time clock (RTC) module, comprising a comparator module, coupled to the real-time clock module, for receiving an initial voltage of the real-time clock module, and comparing the initial voltage with a threshold voltage, to generate a comparison result; and a storage module, coupled to the comparator module, for storing the comparison result and delivering the comparison result to a host circuit; wherein the host circuit determines whether the working status of the real-time clock module is normal or abnormal according to the comparison result.

15 Claims, 3 Drawing Sheets

1
VDD
10
SD1
SD2
N1
RTC
Real-Time Clock Circuit
GND
S_RTC
14
Host Circuit
12
Vi
Sensing Circuit
Vs

ELECTRONIC SYSTEM, SENSING CIRCUIT AND SENSING METHOD

BACKGROUND OF THE INVENTION

1. Field of the Invention

The present invention relates to an electronic system, sensing circuit and sensing method, and more particularly, to an electronic system, sensing circuit and sensing method capable of sensing a working status of a real-time clock circuit.

2. Description of the Prior Art

Among applications of the electronic system, a real-time information is required in various applications to display the correct time to a user. If the electronic system utilizes the computation resource thereof to generate the real-time signal, computation resources for other computation tasks are occupied, and utilizing the computation resource for computing the real-time can also cause the waste of power consumption. Therefore, in the prior art, the electronic system may utilize a real-time clock circuit independent to a processor to generate the real-time signal, so as to efficiently increase the computation efficiency of the electronic system.

In order for the real-time clock circuit to continuously and independently generate the real-time signal without using a power supply system inside the electronic system, an additional battery is arranged for supplying electricity to the real-time clock circuit in the prior art. In addition, a Schottky diode is also utilized for switching the power source, such that the real-time clock circuit may operate using electricity provided by the electronic system when the electronic system is turned on; and the real-time clock circuit may operate using electricity provided by the battery when the electronic system is turned off. However, due to the reverse leakage current of the Schottky diode, the electronic system is hard to identify whether the battery of the real-time clock circuit is normal, and may further misjudge a validity of the real-time signal generated by the real-time clock circuit.

Therefore, how to correctly sense the working status of the real-time clock circuit has become a significant objective in the field.

SUMMARY OF THE INVENTION

It is has become a primary objective of the present invention to provide an electronic system, sensing circuit and sensing method capable of sensing the working status of the real-time clock circuit.

The present invention provides a sensing circuit, for sensing a working status of a real-time clock (RTC) module, comprising a comparator module, coupled to the real-time clock module, for receiving an initial voltage of the real-time clock module, and comparing the initial voltage with a threshold voltage, to generate a comparison result; and a storage module, coupled to the comparator module, for storing the comparison result and delivering the comparison result to a host circuit; wherein the host circuit determines whether the working status of the real-time clock module is normal or abnormal according to the comparison result.

The present invention further provides a sensing method, for sensing a working status of a real-time clock module, comprising receiving an initial voltage of the real-time clock module; comparing the initial voltage with a threshold voltage, to generate a comparison result; and determining whether the working status of the real-time clock module is normal or abnormal according to the comparison result.

The present invention further provides an electronic system, comprising a real-time clock module, for generating a real-time signal; a host circuit, for performing operations according to the real-time signal; and a sensing circuit, coupled to the real-time clock module and the host circuit, for sensing a working status of the real-time clock module, comprising a comparator module, coupled to the real-time clock module, for receiving an initial voltage of the real-time clock module, and comparing the initial voltage with a threshold voltage, to generate a comparison result; and a storage module, coupled to the comparator module and the host circuit, for storing the comparison result, and delivering the comparison result to the host circuit; wherein the host circuit determines the working status of the real-time clock module to be normal or abnormal according to the comparison result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used in the following description and claims to refer to particular components. Those skilled in the art will appreciate, manufacturers may use different terms to refer to a component. This document does not intend to follow the difference component distinguished name as a way to differentiate components but functionally distinguished as a criterion. Mentioned in the following description and claims the terms "include" or "comprising" is an open-ended fashion, and thus should be interpreted to mean "including/include but not limited to." Except, "coupled" are intended to mean either an indirect or direct electrical connection. Accordingly, described herein if a device is coupled to a second device, said first means represents may be directly electrically connected to said second means, or by connecting to other devices or indirectly electrically connected to said first means second means.

Figure 1:
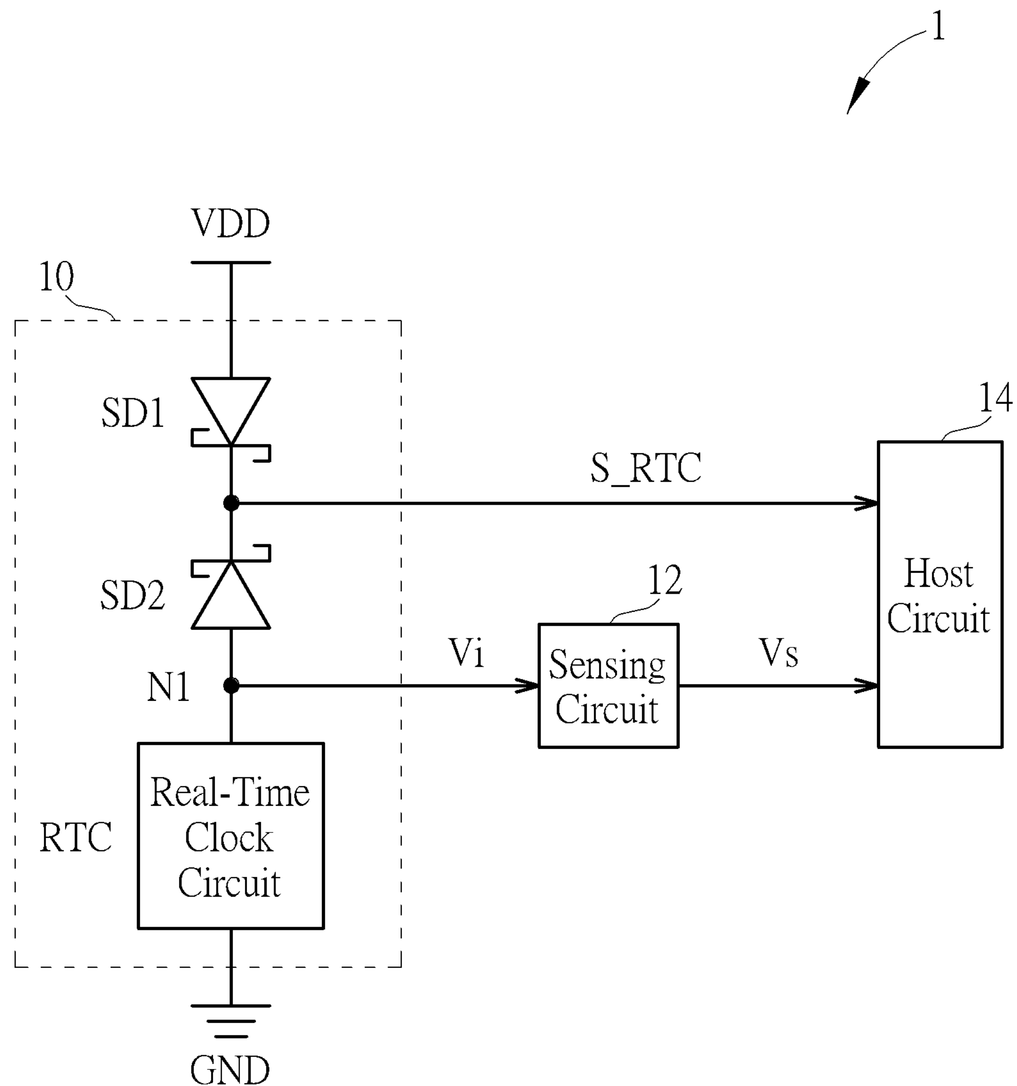
FIG. 1 is a schematic diagram of an electronic system according to an embodiment of the present invention.

Please refer to FIG. 1, which is a schematic diagram of an electronic system 1 according to an embodiment of the present invention. As shown in FIG. 1, the electronic system 1 comprises a real-time clock module 10, a sensing circuit 12 and a host circuit 14. The electronic system 1 may be a desktop computer, a laptop computer, a portable electronic device, a wearable device, a smart phone, an embedded system which is required to record a real-time, or an electronic device or system which displays the real-time to a user. Thus, the real-time clock module 10 is utilized for generating a real-time signal S_RTC to the host circuit 14, and precisely providing the real-time to the host circuit 14, allowing the host circuit 14 to be synchronized with the real world without errors.

The real-time clock module 10 comprises a real-time clock circuit RTC, and Schottky diodes SD1, SD2. An anode of the Schottky diode SD1 is coupled to a power end VDD of the electronic system 1, and a cathode of the Schottky diode SD1 is coupled to a cathode of the Schottky diode SD2. The real-time clock circuit RTC is coupled between an anode of the Schottky diode SD2 and a ground end GND of the electronic system 1. Therefore, the real-time clock circuit RTC, and the Schottky diodes SD1, SD2 are serially connected between the power end VDD and the ground end GND. The real-time clock module 10 may generate the real-time signal S_RTC, and output the real-time signal S_RTC through the cathode of the Schottky diode SD2, such that the host circuit 14 may receive the real-time signal S_RTC. Notably, the real-time clock circuit RTC may be a quartz oscillator, a transmission line oscillator or an oscillator implemented by transistors, as long as the generated real-time signal S_RTC may indicate the real-time. Moreover, in order to provide the correct real-time signal S_RTC to the electronic system 1, a battery (not illustrated in FIG. 1) may be arranged in the real-time clock module 10 for independently supplying electricity to the real-time clock module 10 rather than supplying electricity by a power system inside the electronic system 1, such that the operations of the real-time clock module 10 to generate the real-time signal S_RTC are not affected by ON or OFF of the electronic system 1. Notably, suffered from the reverse leakage current of the Schottky diode SD2, the electronic system 1 is hard to test whether the battery of the real-time clock circuit RTC is functioning, and it is possible for the host circuit 14 to receive the incorrect real-time signal S_RTC. Under such a circumstance, for preventing the electronic system 1 from receiving the incorrect real-time signal S_RTC, an embodiment of the present invention senses a voltage Vi of the real-time clock module 10 when the electronic system 1 is just turned on through the sensing circuit 12, to generate a comparison result Vs, allowing the host circuit 14 to determine whether a working status of the real-time clock circuit RTC is normal or abnormal.

In detail, since the real-time clock circuit RTC records the real-time signal S_RTC continually in real-time, the operations of the real-time clock circuit RTC must be persistent without interruption. No matter if the electronic system 1 is turned on or off, the operations of the real-time clock circuit RTC must always be functioning properly, so as to generate the continuous and correct real-time signal S_RTC. To realize these features, the real-time clock module 10 may obtain electricity through the battery disposed inside the real-time clock circuit RTC, or through the power end VDD of the electronic system 1. Under such a circumstance, the Schottky diodes SD1, SD2 are utilized for switching the power source of the real-time clock circuit RTC. When the electronic system 1 is turned on and providing electricity through the power end VDD, the real-time clock circuit RTC may operate using electricity provided externally from the power end VDD. When the electronic system 1 is turned off and not providing electricity through the power end VDD, the real-time clock circuit RTC may operate using electricity provided internally from the battery. Therefore, through a connection relationship between the real-time clock circuit RTC and the Schottky diodes SD1, SD2, the operations of the real-time clock circuit RTC is not affected by whether the electronic system 1 is turned on or off, and the real-time signal S_RTC may be recorded continuously and correctly.

Notably, when the battery inside the real-time clock circuit RTC malfunctions (e.g. unable to charge, or a charging power of the battery is low) or the battery runs out of electricity, it causes the working status of the real-time clock circuit RTC to be abnormal. Thus, the real-time clock circuit RTC obtains no electricity from the power end VDD of the electronic system 1, which may interrupt the operations of the real-time signal S_RTC, and result in errors of the electronic system 1. However, due to the reverse leakage of the Schottky diode, when the electronic system 1 is turned on and providing electricity through the power end VDD, a reverse leakage current of the Schottky diode SD2 flows into a node N1 between the Schottky diode SD2 and the real-time clock circuit RTC, which causes the voltage Vi of the node N1 to rise gradually. As a result, when the real-time clock circuit RTC is abnormal, the electronic system 1 is not able to determine the working status of the real-time clock circuit RTC, which leads the host circuit 14 to receive the incorrect real-time signal S_RTC.

Therefore, the present invention may compare the voltage Vi with a threshold voltage before the reverse leakage current of the Schottky diode SD2 affects the voltage Vi of the node N1 inside the real-time clock module 10 through the sensing circuit 12. In addition, the comparison result Vs is delivered to the host circuit 14, allowing the host circuit 14 to accordingly determine the working status of the real-time clock module 10, for preventing the host circuit 14 from receiving the incorrect real-time signal S_RTC.

Figure 2:
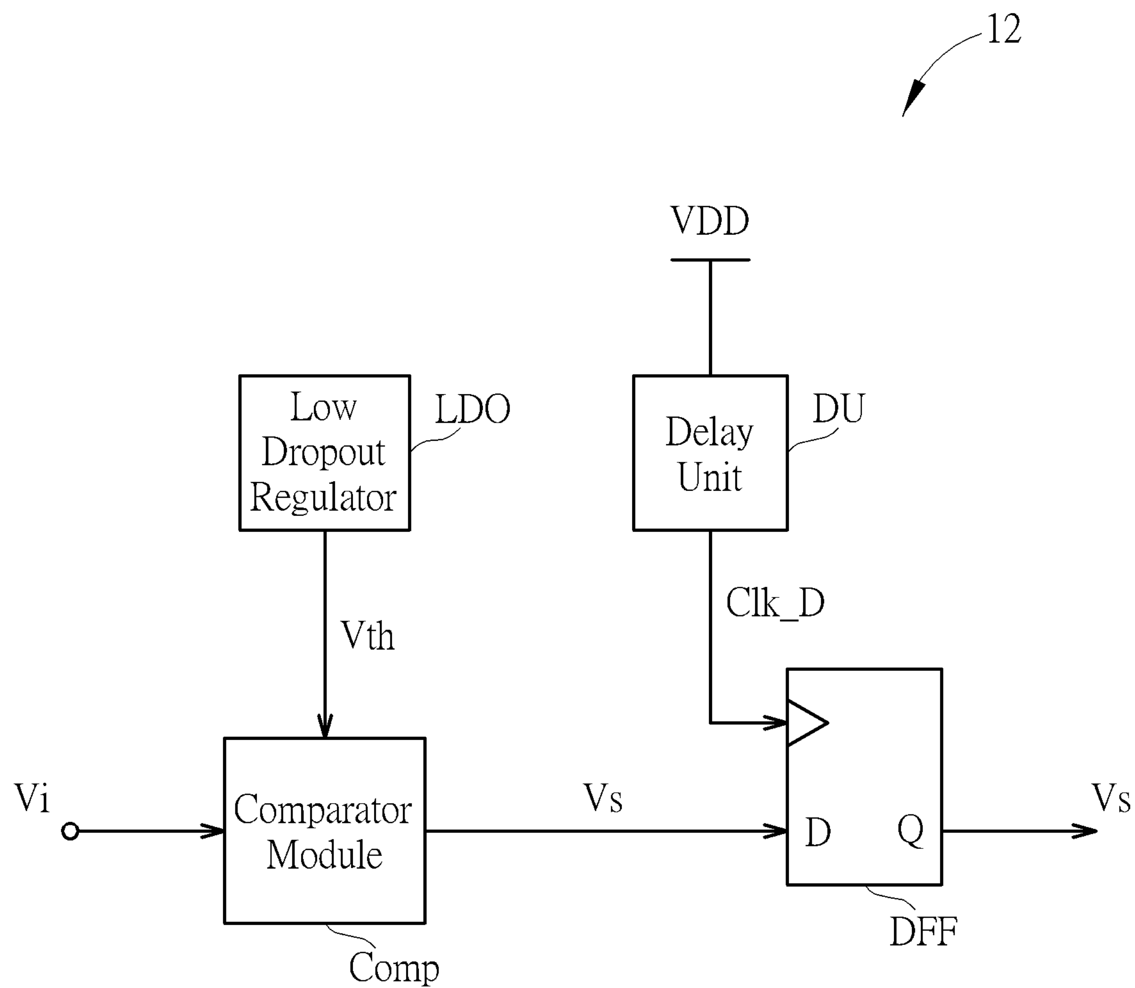
FIG. 2 is a schematic diagram of a sensing circuit according to an embodiment of the present invention.

Please continue referring to FIG. 2, which is a schematic diagram of a sensing circuit 12 according to an embodiment of the present invention. The sensing circuit 12 may obtain the voltage Vi of the real-time clock circuit RTC, for determining whether the working status of the real-time clock circuit RTC is normal or abnormal. As shown in FIG. 2, the sensing circuit 12 may comprise a low dropout regulator LDO, a comparator module Comp, and a D flip-flop DFF. The low dropout regulator LDO may be utilized for providing the threshold voltage. The comparator module Comp is coupled to the real-time clock circuit RTC and the low dropout regulator LDO, for comparing the voltage Vi and the threshold voltage, to generate the comparison result Vs. The D flip-flop DFF is coupled to the comparator module Comp, for storing the comparison result Vs and delivering it to the host circuit 14.

In detail, in the embodiment, when the voltage Vi is greater than or equal to the threshold voltage, the comparator module Comp may generate the comparison result Vs with a high voltage level signal; when the voltage Vi is smaller than the threshold voltage, the comparator module Comp may generate the comparison result Vs with a love voltage level signal. The D flip-flop DFF can store the comparison result Vs of the high voltage level signal or the low voltage level signal, and deliver the comparison result Vs to the host circuit 14, for determining whether the working status of the real-time clock circuit RTC is normal or abnormal. Notably, the sensing circuit 12 takes advantage of its storage characteristic, for obtaining the voltage Vi for comparison, generating the comparison result Vs, and storing it to the D flip-flop DFF before the reverse leakage current of the Schottky diode SD2 changes the voltage Vi of the node N1 inside the real-time clock module 10. As such, the sensing circuit 12 of the present invention may be protected from the reverse leakage current, and correctly deliver the comparison result Vs to the host circuit 14, allowing the host circuit 14 to correctly determine whether the working status of the real-time clock circuit RTC is normal or abnormal.

In another aspect, in order for the D flip-flop DFF to preferably store the comparison result Vs before being affected by the reverse leakage current, a clock signal Clk_D may be generated to the D flip-flop DFF through a delay unit DU. Therefore, the sensing circuit 12 may obtain an initial voltage of the node N1 inside the real-time clock module 10, to accordingly generate the comparison result Vs to the host circuit 14 before the reverse leakage current affects the node N1. Notably, the delay unit DU receives the voltage from the power end VDD, and holds the voltage for an adequate length of delay, to generate the clock signal Clk_D to the D flip-flop DFF. As such, when the electronic system 1 is turned on and providing electricity to the power end VDD, the comparator module Comp may generate the comparison result Vs within the delay provided by the delay unit DU. In addition, since the clock signal Clk_D corresponds to the startup of the power end VDD, the D flip-flop DFF may store the comparison result Vs through the clock signal Clk_D when the electronic system 1 is turned on, which further reduces the design complexity of the clock signal Clk_D through the simple implementation. Of course, the clock signal Clk_D of the present invention may as well be implemented by logic gates or other means, which are also within the scope of the present invention.

Then, after the host circuit 14 receives the comparison result Vs, the host circuit 14 may accordingly determine the working status of the real-time clock circuit RTC is normal or abnormal. When the comparison result Vs indicates that the working status of the real-time clock circuit RTC is normal, the host circuit 14 is capable of performing the normal operation and obtaining the correct real-time according to the real-time signal S_RTC. When the comparison result Vs indicates that the working status of the real-time clock circuit RTC is abnormal, the host circuit 14 does not utilize the real-time signal S_RTC for obtaining the real-time, to prevent errors of the electronic system 1. Furthermore, the host circuit 14 may further generate a warning signal for warning the user when the comparison result Vs indicates that the working status of the real-time clock circuit RTC is abnormal. For example, the warning signal may be a message or a status window displayed on a screen, a flicker signal generated by a light emitting diode, or a warning signal of sound, as long as the warning single is able to notify the user that the working status of the real-time clock circuit RTC is abnormal.

In brief, the sensing circuit 12 of the present invention may sense the voltage Vi of the real-time clock module 10, and obtain the voltage Vi to compare it with the threshold voltage, so as to generate and store the comparison result Vs before the reverse leakage current varies the voltage Vi of the node N1 inside the Schottky diode SD2. In an embodiment of the present invention, the host circuit 14 may further obtain the comparison result Vs, for determining whether the working status of the real-time clock module 10 is normal or abnormal. As such, when the working status of the real-time clock module 10 is abnormal, the real-time signal S_RTC is not used, and the warning signal is generated to alert the user.

Figure 3:
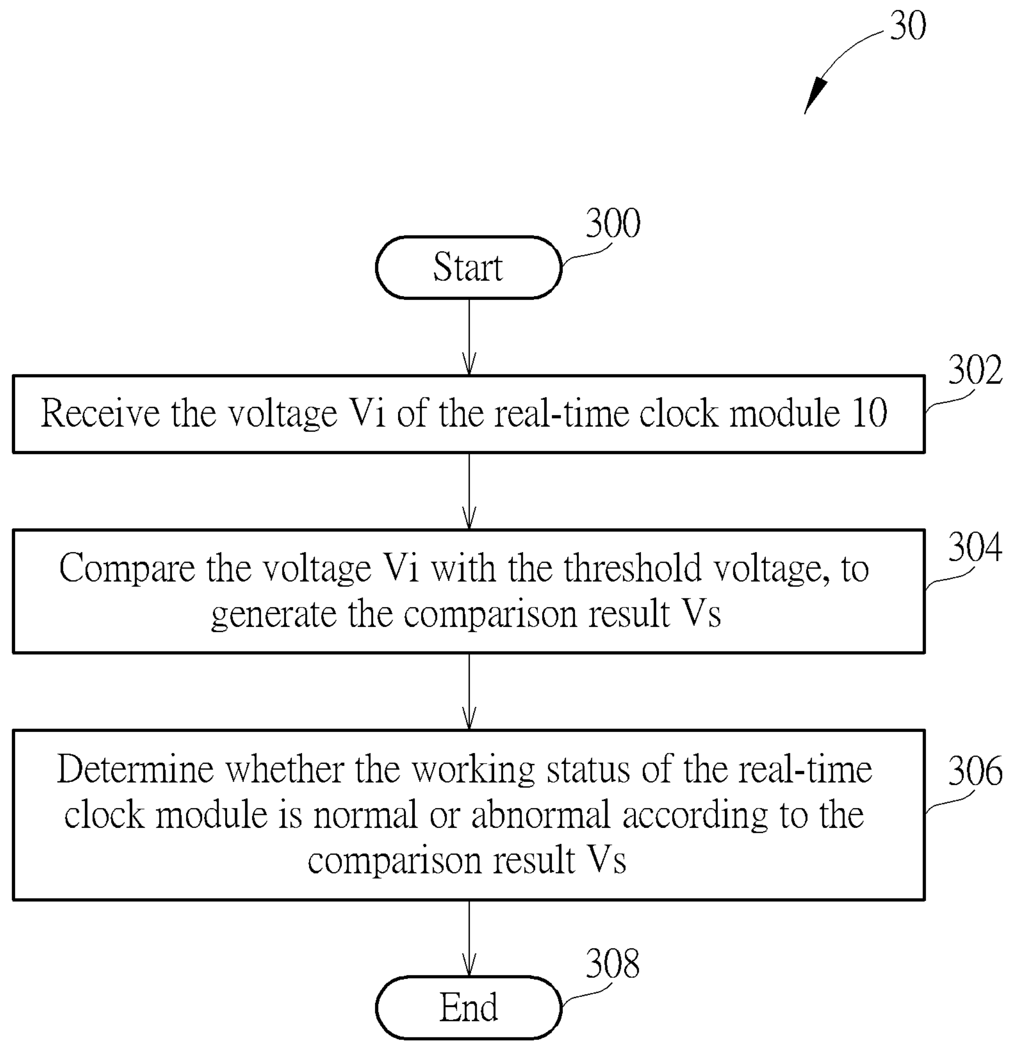
FIG. 3 is a schematic diagram of a process according to an embodiment of the present invention.

The operations of the electronic system 1 stated above may be summarized into a process 30, as shown in FIG. 3. The process 30 includes the following steps:

Step 300: Start.

Step 302: Receive the voltage Vi of the real-time clock module 10.

Step 304: Compare the voltage Vi with the threshold voltage, to generate the comparison result Vs.

Step 306: Determine whether the working status of the real-time clock module is normal or abnormal according to the comparison result Vs.

Step 308: End.

The detailed operations of the process 30 may be referred to the paragraphs stated in the above, which is not narrated herein.

Notably, the embodiments stated in the above are utilized for illustrating the concept of the present invention. Those skilled in the art may make modifications and alterations accordingly, and not limited herein. According to different applications and design concepts, the sensing circuit 12 of the present invention may be modified. For example, the sensing circuit 12 may be a flash analog-to-digital converter (ADC), a pipeline ADC or a successive approximation ADC, etc. As such, the sensing circuit 12 not only compares the voltage Vi with the threshold voltage, but also relies on accuracy of the ADC to determine a voltage region of the voltage Vi, generate the comparison result Vs corresponding to the voltage region, and deliver the comparison result Vs to the host circuit 14. Therefore, the host circuit 14 may determine the working status of the real-time clock module 10 more precisely, and the detailed information may be provided to the user. The host circuit 14 may further alert the user even before the battery of the real-time clock circuit RTC runs out of power. Under such a circumstance, through different implementations of the sensing circuit 12, the host circuit 14 of the present invention may determine the working status of the real-time clock module 10, thus preventing the battery inside the real-time clock circuit RTC from running out of power. The situation that informing the user after the incorrect real-time signal S_RTC is generated and an error of the electronic system 1 occurs may be prevented, further allowing the real-time clock circuit RTC and the electronic system 1 to function properly.

Moreover, the sensing circuit 12 of the present invention may generate the threshold voltage through different ways, and not limited to the low dropout regulator LDO. For instance, the sensing circuit 12 may generate the threshold through a voltage division through resistors, a resistor ladder, or the voltage division through capacitors, etc., as long as the stable threshold voltage may be generated. Alternatively, the sensing circuit 12 of the present invention may be preferably designed as a single ended comparator using a different architecture, to preferably design transistor sizes, to compare the voltage Vi with the threshold voltage and generate the comparison result Vs without acquiring the threshold voltage externally.

In the prior art, due to the leakage current of the Schottky diode, the electronic system may not determine the working status of the real-time clock circuit, and is unable to prevent the error of the electronic system caused by utilizing the incorrect real-time clock signal. In comparison, the sensing circuit of the present invention may sense the real-time clock circuit to generate the comparison result when the electronic system is just turned on, allowing the electronic system to accordingly determine whether the working status of the real-time clock circuit is normal or abnormal. Therefore, the real-time clock circuit and the electronic circuit may be protected and function properly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sensing circuit, for sensing a working status of a real-time clock (RTC) module, comprising:

a comparator module, coupled to the real-time clock module, for receiving an initial voltage of the real-time clock module, and comparing the initial voltage with a threshold voltage, to generate a comparison result; and a storage module, coupled to the comparator module, for storing the comparison result and delivering the comparison result to a host circuit;

wherein the host circuit determines whether the working status of the real-time clock module is normal or abnormal according to the comparison result;

wherein the initial voltage is a voltage of a node of the real-time clock module when the real-time clock module is just switched from being supplied by a battery of the real-time clock module to be supplied by a power end.

2. The sensing circuit of claim 1, further comprising a low dropout regulator (LDO), coupled to the comparator module, for providing the threshold voltage.

3. The sensing circuit of claim 1, wherein when the comparison result indicates that the initial voltage is greater than or equal to the threshold voltage, the host circuit determines the working status of the real-time clock module to be normal; and when the comparison result indicates that the initial voltage is smaller than the threshold voltage, the host circuit determines the working status of the real-time clock module to be abnormal.

4. The sensing circuit of claim 1, wherein the storage module is a D flip-flop, and the comparison result is stored in the D flip-flop as a high voltage level signal or a low voltage level signal.

5. The sensing circuit of claim 1, wherein the host circuit generates a warning signal when the working status of the real-time clock module is determined to be abnormal.

6. A sensing method, for sensing a working status of a real-time clock module, comprising:

receiving an initial voltage of the real-time clock module;

comparing the initial voltage with a threshold voltage, to generate a comparison result; and determining whether the working status of the real-time clock module is normal or abnormal according to the comparison result;

wherein the initial voltage is a voltage of a node of the real-time clock module when the real-time clock module is just switched from being supplied by a battery of the real-time clock module to be supplied by a power end.

7. The sensing method of claim 6, further comprising:

generating the threshold voltage by a low dropout regulator.

8. The sensing method of claim 6, wherein the comparison result indicates a voltage relationship between the initial voltage and the threshold voltage with a high voltage level signal or a low voltage level signal.

9. The sensing method of claim 6, wherein the step of determining whether the working status of the real-time clock module is normal or abnormal according to the comparison result comprises:

when the comparison result indicates that the initial voltage is greater than or equal to the threshold voltage, determining the working status of the real-time clock module to be normal; and when the comparison result indicates that the initial voltage is smaller than the threshold voltage, determining the working status of the real-time clock module to be abnormal.

10. The sensing method of claim 6, further comprising:

when the working status of the real-time clock module is determined to be abnormal, generating a warning signal.

11. An electronic system, comprising:

a real-time clock module, for generating a real-time signal;

a host circuit, for performing operations according to the real-time signal; and a sensing circuit, coupled to the real-time clock module and the host circuit, for sensing a working status of the real-time clock module, comprising:

a comparator module, coupled to the real-time clock module, for receiving an initial voltage of the real-time clock module, and comparing the initial voltage with a threshold voltage, to generate a comparison result; and a storage module, coupled to the comparator module and the host circuit, for storing the comparison result, and delivering the comparison result to the host circuit;

wherein the host circuit determines the working status of the real-time clock module to be normal or abnormal according to the comparison result;

wherein the initial voltage is a voltage of a node of the real-time clock module when the real-time clock module is just switched from being supplied by a battery of the real-time clock module to be supplied by a power end.

12. The electronic system of claim 11, further comprising a low dropout regulator, coupled to the comparator module, for providing the threshold voltage.

13. The electronic system of claim 11, wherein when the comparison result indicates that the initial voltage is greater than or equal to the threshold voltage, the host circuit determines the working status of the real-time clock module to be normal; and when the comparison result indicates that the initial voltage is smaller than the threshold voltage, the host circuit determines the working status of the real-time clock module to be abnormal.

14. The electronic system of claim 11, wherein the storage module is a D flip-flop, and the comparison result is stored in the D flip-flop as a high voltage level signal or a low voltage level signal.

15. The electronic system of claim 11, wherein the host circuit generates a warning signal when the working status of the real-time clock module is determined to be abnormal.

* * * * *